(12) United States Patent
Zeng et al.

(10) Patent No.: US 9,698,372 B2
(45) Date of Patent: Jul. 4, 2017

(54) OLED TOUCH CONTROL DISPLAY DEVICE AND MANUFACTURE METHOD THEREOF

(71) Applicant: Shenzhen China Star Optoelectronics Technology Co., Ltd., Shenzhen, Guangdong (CN)

(72) Inventors: Weijing Zeng, Guangdong (CN); Changcheng Lo, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 147 days.

(21) Appl. No.: 14/424,526

(22) PCT Filed: Feb. 9, 2015

(86) PCT No.: PCT/CN2015/072498
§ 371 (c)(1),
(2) Date: Feb. 27, 2015

(87) PCT Pub. No.: WO2016/095332
PCT Pub. Date: Jun. 23, 2016

(65) Prior Publication Data
US 2016/0343984 A1  Nov. 24, 2016

(30) Foreign Application Priority Data

Dec. 17, 2014 (CN) .......................... 2014 1 0789900

(51) Int. Cl.
*H01L 51/52* (2006.01)
*H01L 51/56* (2006.01)
(Continued)

(52) U.S. Cl.
CPC .......... *H01L 51/5253* (2013.01); *G06F 3/045* (2013.01); *G06F 3/0412* (2013.01);
(Continued)

(58) Field of Classification Search
CPC combination set(s) only.
See application file for complete search history.

(56) References Cited

U.S. PATENT DOCUMENTS

2008/0309226 A1* 12/2008 Kim ................... H01L 51/5259
313/504
2012/0070614 A1* 3/2012 Takahashi ............ G02B 5/0221
428/141
(Continued)

FOREIGN PATENT DOCUMENTS

CN    201749442 U    2/2011
CN    102592513 A    7/2012

*Primary Examiner* — Kyoung Lee
*Assistant Examiner* — Ratisha Mehta
(74) *Attorney, Agent, or Firm* — Andrew C. Cheng

(57) ABSTRACT

The present invention provides an OLED touch control display device and a manufacture method thereof. The OLED touch control display device comprises: a transparent substrate (10), a transparent package cover plate (20), an OLED thin film element (11) located at one side of the transparent substrate (10) facing the transparent package cover plate (20), a thin film package layer (12) being located on the OLED thin film element (11) and completely covering the OLED thin film element (11), a transparent conductive outer layer (31) located on the thin film package layer (12), an antiglare layer (34) located at one side of the transparent package cover plate (20) facing the transparent substrate (10), a transparent conductive inner layer (33) located under the antiglare layer (34) and a transparent isolation dot layer (32) located under the transparent conductive inner layer (33); the transparent conductive outer layer (31), the transparent isolation dot layer (32) and the transparent conductive inner layer (33) construct a touch control panel (30); the OLED touch control display device reduces the difficulty of the manufacture process and contributes to raise the productivity.

13 Claims, 3 Drawing Sheets

(51) Int. Cl.
  *G06F 3/041*   (2006.01)
  *H01L 27/32*   (2006.01)
  *G06F 3/045*   (2006.01)

(52) U.S. Cl.
  CPC ............ *H01L 27/323* (2013.01); *H01L 51/56* (2013.01); *G06F 2203/04103* (2013.01); *H01L 51/5218* (2013.01); *H01L 51/5234* (2013.01); *H01L 51/5281* (2013.01)

(56) References Cited

U.S. PATENT DOCUMENTS

| | | | |
|---|---|---|---|
| 2012/0307169 A1* | 12/2012 | Ohyama | G02B 27/2214 349/33 |
| 2014/0002777 A1* | 1/2014 | Kim | G02F 1/133362 349/106 |
| 2014/0183478 A1* | 7/2014 | Lee | H01L 51/56 257/40 |
| 2014/0306198 A1* | 10/2014 | Im | H01L 51/0013 257/40 |

* cited by examiner

OLED TOUCH CONTROL DISPLAY DEVICE AND MANUFACTURE METHOD THEREOF

FIELD OF THE INVENTION

The present invention relates to a display technology field, and more particularly to an OLED touch control display device and a manufacture method thereof.

BACKGROUND OF THE INVENTION

In recent years, Liquid Crystal Display (LCD), Organic Light Emitting Diode (OLED) and other panel display devices have gradually replaced the CRT displays and become the major production in the display device market. The OLED display device possesses many outstanding properties of self-illumination, low driving voltage, high luminescence efficiency, fast response, high clarity and contrast, near 180° view angle, wide range of working temperature, applicability of flexible display and large scale full color display. The OLED is considered as the most potential flat panel display technology.

The OLED display device generally comprises a substrate, a package cover plate oppositely located with the substrate, an anode located on the substrate, a Hole Injection Layer located on the anode, a Hole Transporting Layer located on the Hole Injection Layer, an emitting layer located on the Hole Transporting Layer, an Electron Transport Layer located on the emitting layer, an Electron Injection Layer located on the Electron Transport Layer and a Cathode located on the Electron Injection Layer. As the OLED display device works, the Hole and the Electron are injected to the emitting layer, these electrons and the holes are combined to generate excited electron-hole pairs, and the excited electron-hole pairs are converted from the excited state to the ground state for achieving illumination.

With the development of portable electronic display devices, the touch panel provides a new human machine interactive interface. The usage is more direct and with more humanization. Forming a touch control device with combining the touch panel and the flat display device is capable of providing the touch control function to the flat display device. With the fingers, the stylus for inputting, the operation can be more intuitive and easy.

For the present OLED touch control display devices, the OLED display device and the touch control panel are separately manufactured, and then the two are combined with assembly. Thus, a regular OLED touch control display device is thicker, and generally comprises a structure of four layers, which respectively are an OLED substrate, an OLED cover plate, a touch control panel substrate and a touch control panel cover plate. FIG. 1 shows an OLED touch control display device according to prior art with improvement, comprising: a display panel substrate 100, a display panel cover plate 200 and a touch control panel main body 300. The display panel substrate 100 comprises a substrate main body 110 and an antiglare layer 120 which is an outermost layer of the substrate main body 110; the touch control panel main body 300 is integrated between the substrate main body 110 and the antiglare layer 120, and comprises a transparent conductive inner layer 330 located at one side of the antiglare layer 120 facing the substrate main body 110, a transparent isolation dot layer 320 located under the transparent conductive inner layer 330 and a transparent conductive outer layer 310 located at one side of the substrate main body 110 facing the antiglare layer 120. The display panel cover plate 200 is located at one side of the substrate main body 110 away from the antiglare layer 120, and connected with the display panel substrate 100. The remaining problem of the aforesaid OLED touch control display device with improvement is that because the antiglare layer 120 is flexible polymer material in general, directly manufacturing the touch control panel main body 300 thereon must face a certain difficulty in the manufacture process and leads to the lower productivity.

SUMMARY OF THE INVENTION

An objective of the present invention is to provide an OLED touch control display device, of which the damage of the touch control panel to the organic material layer in the OLED display device can be prevented, and the thickness of the OLED touch control display device can be diminished, and meanwhile, the difficulty of the manufacture process can be reduced for contributing to raise the productivity.

Another objective of the present invention is to provide a manufacture method of an OLED touch control display device, of which the difficulty of the manufacture process can be reduced to raise the productivity, and the damage of the touch control panel to the organic material layer in the OLED display device can be prevented, and the thickness of the OLED touch control display device can be diminished.

For realizing the aforesaid objectives, the present invention provides an OLED touch control display device, comprising a transparent substrate, a transparent package cover plate oppositely located to the transparent substrate, an OLED thin film element located at one side of the transparent substrate facing the transparent package cover plate, a thin film package layer being located on the OLED thin film element and completely covering the OLED thin film element, a transparent conductive outer layer located on the thin film package layer, an antiglare layer located at one side of the transparent package cover plate facing the transparent substrate, a transparent conductive inner layer located under the antiglare layer and a transparent isolation dot layer located under the transparent conductive inner layer;

the transparent conductive outer layer, the transparent isolation dot layer and the transparent conductive inner layer construct a touch control panel.

The transparent substrate is a glass substrate and the transparent package cover plate is a glass cover plate.

The OLED thin film element comprises: a reflective anode metal layer, a transparent cathode metal layer and an organic material layer located between the reflective anode metal layer and the transparent cathode metal layer.

The thin film package layer comprises: a first inorganic passivation layer located on the OLED thin film element, an organic flat layer located on the first inorganic passivation layer, a second inorganic passivation layer located on the organic flat layer, and all the first inorganic passivation layer, the organic flat layer and the second inorganic passivation layer are transparent.

The transparent substrate and the transparent package cover plate are bonded together with a glue frame or a whole side of assembly glue, to form a sealed OLED touch control display device.

The present invention further provides a manufacture method of an OLED touch control display device, comprising steps of:

step 1, providing a transparent package cover plate, and forming an antiglare layer on the transparent package cover plate;

step 2, forming a transparent conductive inner layer on the antiglare layer;

step 3, forming a transparent isolation dot layer on the transparent conductive inner layer;

step 4, providing a transparent substrate, and forming an OLED thin film element on the transparent substrate;

step 5, forming a thin film package layer on the OLED thin film element and completely covering the OLED thin film element;

step 6, forming a transparent conductive outer layer on the thin film package layer;

step 7, coating a glue frame at peripheric edges of the transparent package cover plate or transparent assembly glue on a whole side, and bonding the transparent substrate and the transparent package cover plate together in vacuum, and curing the glue frame or the transparent assembly glue to form sealed OLED touch control display device; wherein the transparent conductive outer layer, the transparent isolation dot layer and the transparent conductive inner layer construct a touch control panel.

The transparent package cover plate is a glass cover plate and the transparent substrate is a glass substrate.

In the step 1, the antiglare layer is polymer containing antiglare particles, which is formed by coating, drying and curing;

in the step 2, the transparent conductive inner layer is formed by sputtering or thermal evaporating;

in the step 3, the transparent isolation dot layer is formed by screen printing;

in the step 6, the transparent conductive outer layer is formed by sputtering or thermal evaporating.

In the step 4, the OLED thin film element comprises a reflective anode metal layer, a transparent cathode metal layer and an organic material layer located between the reflective anode metal layer and the transparent cathode metal layer.

In the step 5, the thin film package layer comprises: a first inorganic passivation layer located on the OLED thin film element, an organic flat layer located on the first inorganic passivation layer, a second inorganic passivation layer located on the organic flat layer, and all the first inorganic passivation layer, the organic flat layer and the second inorganic passivation layer are transparent.

The present invention further provides an OLED touch control display device, comprising a transparent substrate, a transparent package cover plate oppositely located to the transparent substrate, an OLED thin film element located at one side of the transparent substrate facing the transparent package cover plate, a thin film package layer being located on the OLED thin film element and completely covering the OLED thin film element, a transparent conductive outer layer located on the thin film package layer, an antiglare layer located at one side of the transparent package cover plate facing the transparent substrate, a transparent conductive inner layer located under the antiglare layer and a transparent isolation dot layer located under the transparent conductive inner layer.

the transparent conductive outer layer, the transparent isolation dot layer and the transparent conductive inner layer construct a touch control panel;

wherein the transparent substrate is a glass substrate and the transparent package cover plate is a glass cover plate;

wherein the OLED thin film element comprises: a reflective anode metal layer, a transparent cathode metal layer and an organic material layer located between the reflective anode metal layer and the transparent cathode metal layer.

The benefits of the present invention are: the present invention provides an OLED touch control display device and a manufacture method thereof, and by integrating the touch control panel between the transparent substrate and the transparent package cover plate, the thickness of the OLED touch control display device can be diminished; by locating the thin film package layer on the OLED thin film element, the damage of the touch control panel to the organic material layer can be prevented; by locating the antiglare layer at one side of the transparent package cover plate facing the transparent substrate to load the flexible antiglare layer on the transparent package cover plate, and then manufacturing the touch control panel on the antiglare layer, the difficulty of the manufacture process can be reduced for contributing to raise the productivity.

In order to better understand the characteristics and technical aspect of the invention, please refer to the following detailed description of the present invention is concerned with the diagrams, however, provide reference to the accompanying drawings and description only and is not intended to be limiting of the invention.

BRIEF DESCRIPTION OF THE DRAWINGS

The technical solution and the beneficial effects of the present invention are best understood from the following detailed description with reference to the accompanying figures and embodiments.

In drawings.

DETAILED DESCRIPTION OF PREFERRED EMBODIMENTS

For better explaining the technical solution and the effect of the present invention, the present invention will be further described in detail with the accompanying drawings and the specific embodiments.

Figure 1:
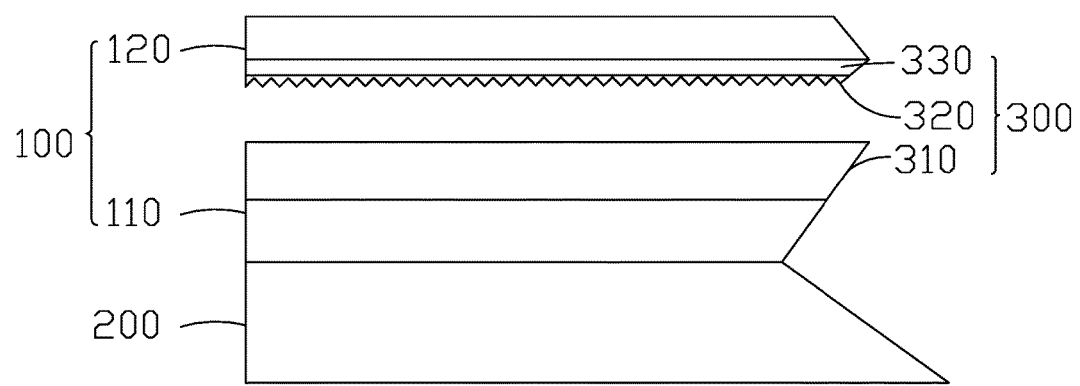
FIG. 1 is a structural diagram of an OLED touch control display device according to prior art.
Figure 2:
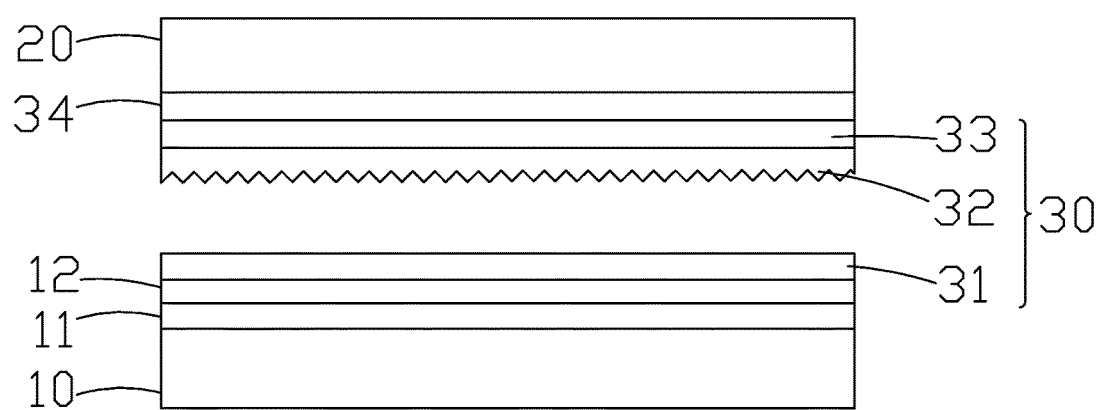
FIG. 2 is a structural diagram of an OLED touch control display device according to the present invention.

Please refer to FIG. 2. The present invention provides an OLED touch control display device, comprising a transparent substrate 10, a transparent package cover plate 20 oppositely located to the transparent substrate 10, an OLED thin film element 11 located at one side of the transparent substrate 10 facing the transparent package cover plate 20, a thin film package layer 12 being located on the OLED thin film element 11 and completely covering the OLED thin film element 11, a transparent conductive outer layer 31 located on the thin film package layer 12, an antiglare layer 34 located at one side of the transparent package cover plate 20 facing the transparent substrate 10, a transparent conductive inner layer 33 located under the antiglare layer 34 and a transparent isolation dot layer 32 located under the transparent conductive inner layer 33.

The transparent conductive outer layer 31, the transparent isolation dot layer 32 and the transparent conductive inner layer 33 construct a touch control panel 30. The OLED touch control display device integrates the touch control panel 30 between the transparent substrate 10 and the transparent package cover plate 20 and an independent touch control panel cover plate is not required which can diminish the thickness of the OLED touch control display device.

Specifically, the transparent substrate 10 is a glass substrate and the transparent package cover plate 20 is a glass cover plate.

The OLED thin film element 11 comprises: a reflective anode metal layer, a transparent cathode metal layer and an organic material layer located between the reflective anode metal layer and the transparent cathode metal layer. Furthermore, the organic material layer further comprises a Hole Injection Layer, a Hole Transporting Layer, an emitting material layer, an Electron Transport Layer and an Electron Injection Layer.

The thin film package layer 12 comprises: a first inorganic passivation layer located on the OLED thin film element 11, an organic flat layer located on the first inorganic passivation layer, a second inorganic passivation layer located on the organic flat layer, and all the first inorganic passivation layer, the organic flat layer and the second inorganic passivation layer are transparent. The thin film package layer 12 is located on the OLED thin film element 11 and completely covers the OLED thin film element 11 to protect the OLED thin film element 11 and prevent the damage of the touch control panel 30 to the organic material layer.

The antiglare layer 34 is flexible polymer containing antiglare particles (such as acrylic resin micro particles, polymethylmethacrylate micro particles, etc.). By locating the antiglare layer 34 at one side of the transparent package cover plate 20 facing the transparent substrate 10 to load the flexible antiglare layer 34 on the transparent package cover plate 20, and then manufacturing the transparent conductive inner later 33 and the transparent isolation dot layer 32 of the touch control panel 30 on the antiglare layer 34, the difficulty of the manufacture process can be reduced for contributing to raise the productivity.

The transparent substrate 10 and the transparent package cover plate 20 are bonded together with a glue frame or a whole side of assembly glue, to form a sealed OLED touch control display device.

Figure 3:
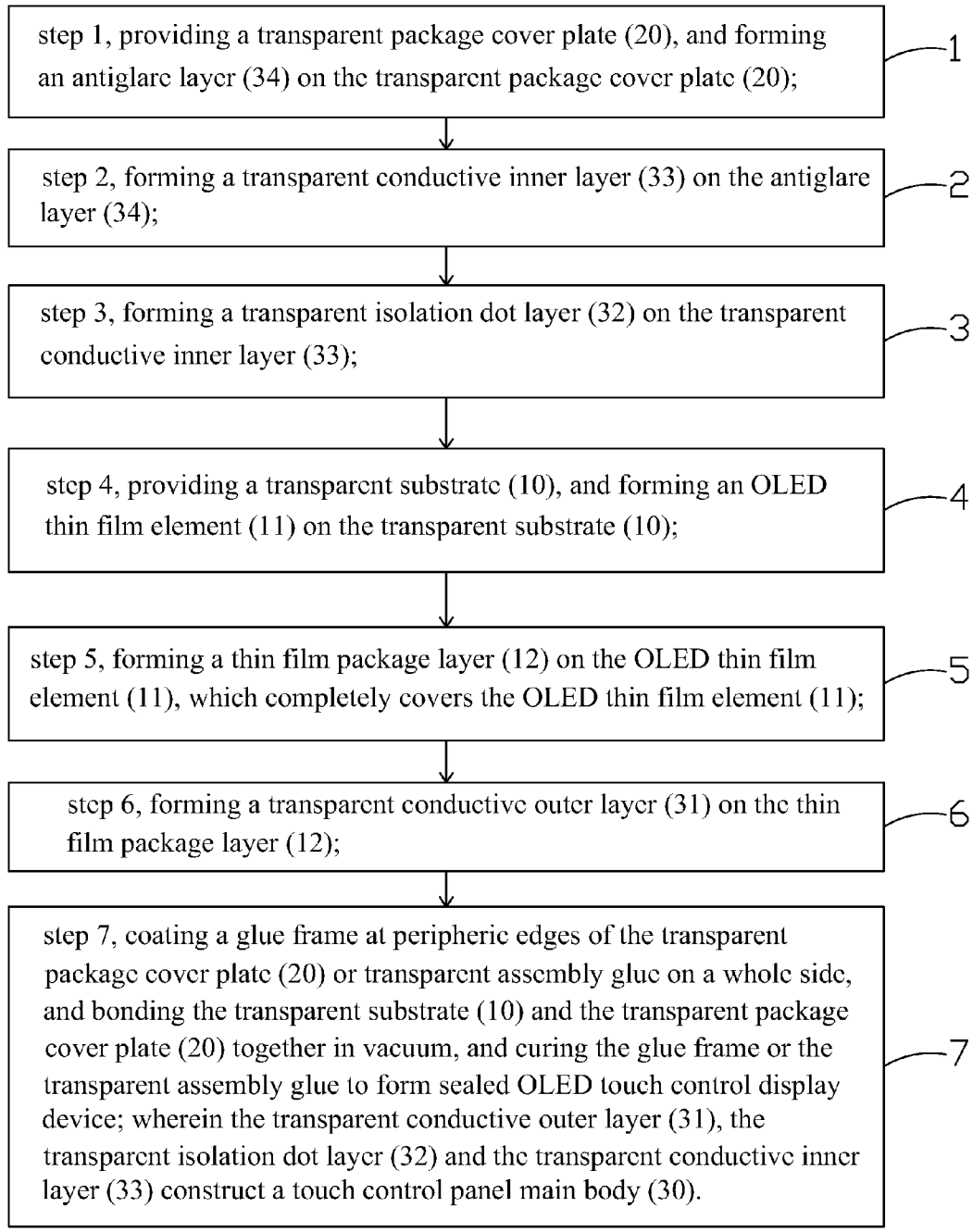
FIG. 3 is a flowchart of a manufacture method of an OLED touch control display device according to the present invention.

Please refer to FIG. 3 in combination of FIG. 2. The present invention further provides a manufacture method of an OLED touch control display device, comprising steps of:

step 1, providing a transparent package cover plate 20, and forming an antiglare layer 34 on the transparent package cover plate 20.

Specifically, the transparent package cover plate 20 is a glass cover plate.

The antiglare layer 34 is flexible polymer containing antiglare particles (such as acrylic resin micro particles, polymethylmethacrylate micro particles, etc.), which is formed by coating, drying and curing.

step 2, forming a transparent conductive inner layer 33 on the antiglare layer 34.

Specifically, the transparent conductive inner layer 33 is formed by sputtering or thermal evaporating.

step 3, forming a transparent isolation dot layer 32 on the transparent conductive inner layer 33.

Specifically, the transparent isolation dot layer 32 is formed by screen printing.

step 4, providing a transparent substrate 10, and sequentially forming a reflective anode metal layer, a transparent cathode metal layer and an organic material layer on the transparent substrate 10, and the reflective anode metal layer, the transparent cathode metal layer and the organic material layer construct an OLED thin film element 11.

Specifically, the transparent package substrate 10 is a glass substrate.

The organic material layer further comprises a Hole Injection Layer, a Hole Transporting Layer, an emitting material layer, an Electron Transport Layer and an Electron Injection Layer.

step 5, sequentially forming a first inorganic passivation layer, which completely covers the OLED thin film element 11 on the OLED thin film element 11, an organic flat layer located on the first inorganic passivation layer and a second inorganic passivation layer located on the organic flat layer, and all the first inorganic passivation layer, the organic flat layer and the second inorganic passivation layer are transparent, the three construct a thin film package layer 12.

step 6, forming a transparent conductive outer layer 31 on the thin film package layer 12.

Specifically, the transparent conductive outer layer 31 is formed by sputtering or thermal evaporating.

step 7, coating a glue frame at peripheric edges of the transparent package cover plate 20 or transparent assembly glue on a whole side, and bonding the transparent substrate 10 and the transparent package cover plate 20 together in vacuum, and curing the glue frame or the transparent assembly glue to form sealed OLED touch control display device; wherein the transparent conductive outer layer 31, the transparent isolation dot layer 32 and the transparent conductive inner layer 33 construct a touch control panel 30.

In the aforesaid manufacture method of the OLED touch control display device, by integrating the touch control panel 30 between the transparent substrate 10 and the transparent package cover plate 20, the thickness of the OLED touch control display device can be diminished; by locating the thin film package layer 12 on the OLED thin film element 11, the damage of the touch control panel 30 to the organic material layer can be prevented; by locating the antiglare layer 34 at one side of the transparent package cover plate 20 facing the transparent substrate 10 to load the flexible antiglare layer 34 on the transparent package cover plate 20, and then manufacturing the transparent conductive inner layer 33 and the transparent isolation dot layer 32 of the touch control panel 30 on the antiglare layer 34, the difficulty of the manufacture process can be reduced for contributing to raise the productivity.

In conclusion, in the OLED touch control display device and the manufacture method thereof according to the present invention, by integrating the touch control panel between the transparent substrate and the transparent package cover plate, the thickness of the OLED touch control display device can be diminished; by locating the thin film package layer on the OLED thin film element, the damage of the touch control panel to the organic material layer can be prevented; by locating the antiglare layer at one side of the transparent package cover plate facing the transparent substrate to load the flexible antiglare layer on the transparent package cover plate, and then manufacturing the touch control panel on the antiglare layer, the difficulty of the manufacture process can be reduced for contributing to raise the productivity.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. An organic light emitting diode (OLED) touch control display device, comprising a transparent substrate, a transparent package cover plate oppositely located to the transparent substrate, an OLED thin film element located at one side of the transparent substrate facing the transparent package cover plate, a thin film package layer being located on the OLED thin film element and completely covering the OLED thin film element, a transparent conductive outer layer located on the thin film package layer, an antiglare layer located at one side of the transparent package cover plate facing the transparent substrate, a transparent conductive inner layer located under the antiglare layer and a transparent isolation dot layer located under the transparent conductive inner layer;

wherein the antiglare layer has a side opposite to the transparent package cover plate, the side comprising a substantially flat and smooth surface on which the transparent conductive inner layer is formed so as to provide substantially consistent spacing between the transparent conductive inner layer and the transparent conductive outer layer; and the transparent conductive outer layer, the transparent isolation dot layer and the transparent conductive inner layer construct a touch control panel.

2. The OLED touch control display device according to claim 1, wherein the transparent substrate is a glass substrate and the transparent package cover plate is a glass cover plate.

3. The OLED touch control display device according to claim 1, wherein the OLED thin film element comprises: a reflective anode metal layer, a transparent cathode metal layer and an organic material layer located between the reflective anode metal layer and the transparent cathode metal layer.

4. The OLED touch control display device according to claim 1, wherein the thin film package layer comprises: a first inorganic passivation layer located on the OLED thin film element, an organic flat layer located on the first inorganic passivation layer, a second inorganic passivation layer located on the organic flat layer, and all the first inorganic passivation layer, the organic flat layer and the second inorganic passivation layer are transparent.

5. The OLED touch control display device according to claim 1, wherein the transparent substrate and the transparent package cover plate are bonded together with a glue frame or a whole side of transparent assembly glue, to form a sealed OLED touch control display device.

6. A manufacture method of an organic light emitting diode (OLED) touch control display device, comprising steps of:

step 1, providing a transparent package cover plate, and forming an antiglare layer on the transparent package cover plate;

step 2, forming a transparent conductive inner layer on the antiglare layer;

step 3, forming a transparent isolation dot layer on the transparent conductive inner layer;

step 4, providing a transparent substrate, and forming an OLED thin film element on the transparent substrate;

step 5, forming a thin film package layer on the OLED thin film element and completely covering the OLED thin film element;

step 6, forming a transparent conductive outer layer on the thin film package layer; and step 7, coating a glue frame at peripheral edges of the transparent package cover plate or transparent assembly glue on a whole side, and bonding the transparent substrate and the transparent package cover plate together in vacuum, and curing the glue frame or the transparent assembly glue to form sealed OLED touch control display device; wherein the antiglare layer has a side opposite to the transparent package cover plate, the side comprising a substantially flat and smooth surface on which the transparent conductive inner layer is formed so as to provide substantially consistent spacing between the transparent conductive inner layer and the transparent conductive outer layer; and the transparent conductive outer layer, the transparent isolation dot layer and the transparent conductive inner layer construct a touch control panel.

7. The manufacture method of the OLED touch control display device according to claim 6, wherein the transparent package cover plate is a glass cover plate and the transparent substrate is a glass substrate.

8. The manufacture method of the OLED touch control display device according to claim 6, wherein in step 1, the antiglare layer is polymer containing antiglare particles, which is formed by coating, drying and curing;

wherein in step 2, the transparent conductive inner layer is formed by sputtering or thermal evaporating;

in step 3, the transparent isolation dot layer is formed by screen printing; and in step 6, the transparent conductive outer layer is formed by sputtering or thermal evaporating.

9. The manufacture method of the OLED touch control display device according to claim 6, wherein in step 4, the OLED thin film element comprises a reflective anode metal layer, a transparent cathode metal layer and an organic material layer located between the reflective anode metal layer and the transparent cathode metal layer.

10. The manufacture method of the OLED touch control display device according to claim 6, wherein in step 5, the thin film package layer comprises: a first inorganic passivation layer located on the OLED thin film element, an organic flat layer located on the first inorganic passivation layer, a second inorganic passivation layer located on the organic flat layer, and all the first inorganic passivation layer, the organic flat layer and the second inorganic passivation layer are transparent.

11. An organic light emitting diode (OLED) touch control display device, comprising a transparent substrate, a transparent package cover plate oppositely located to the transparent substrate, an OLED thin film element located at one side of the transparent substrate facing the transparent package cover plate, a thin film package layer being located on the OLED thin film element and completely covering the OLED thin film element, a transparent conductive outer layer located on the thin film package layer, an antiglare layer located at one side of the transparent package cover plate facing the transparent substrate, a transparent conductive inner layer located under the antiglare layer and a transparent isolation dot layer located under the transparent conductive inner layer;

wherein the antiglare layer has a side opposite to the transparent package cover plate, the side comprising a substantially flat and smooth surface on which the transparent conductive inner layer is formed so as to provide substantially consistent spacing between the transparent conductive inner layer and the transparent conductive outer layer; and the transparent conductive outer layer, the transparent isolation dot layer and the transparent conductive inner layer construct a touch control panel;

wherein the transparent substrate is a glass substrate and the transparent package cover plate is a glass cover plate; and wherein the OLED thin film element comprises: a reflective anode metal layer, a transparent cathode metal layer and an organic material layer located between the reflective anode metal layer and the transparent cathode metal layer.

12. The OLED touch control display device according to claim 11, wherein the thin film package layer comprises: a first inorganic passivation layer located on the OLED thin film element, an organic flat layer located on the first inorganic passivation layer, a second inorganic passivation layer located on the organic flat layer, and all the first inorganic passivation layer, the organic flat layer and the second inorganic passivation layer are transparent.

13. The OLED touch control display device according to claim 11, wherein the transparent substrate and the transparent package cover plate are bonded together with a glue frame or a whole side of assembly glue, to form a sealed OLED touch control display device.

* * * * *